US011477914B2

(12) United States Patent
Chen et al.

(10) Patent No.: US 11,477,914 B2
(45) Date of Patent: Oct. 18, 2022

(54) IMMERSION LIQUID COOLING TANK ASSEMBLY

(71) Applicant: Quanta Computer Inc., Taoyuan (TW)

(72) Inventors: Chao-Jung Chen, Taoyuan (TW);
Yu-Nien Huang, Taoyuan (TW);
Guo-Xiang Hu, Taoyuan (TW)

(73) Assignee: QUANTA COMPUTER INC., Taoyuan (TW)

(*) Notice: Subject to any disclaimer, the term of this patent is extended or adjusted under 35 U.S.C. 154(b) by 0 days.

(21) Appl. No.: 17/236,557

(22) Filed: Apr. 21, 2021

(65) Prior Publication Data

US 2022/0225528 A1    Jul. 14, 2022

Related U.S. Application Data

(60) Provisional application No. 63/137,473, filed on Jan. 14, 2021.

(51) Int. Cl.
H05K 7/20            (2006.01)

(52) U.S. Cl.
CPC ......... H05K 7/203 (2013.01); H05K 7/20318 (2013.01); H05K 7/20327 (2013.01)

(58) Field of Classification Search
CPC ............... H05K 7/203; H05K 7/20236; H05K 7/20809; H05K 7/20772; H05K 7/20781; H05K 7/20818; H05K 7/20272; H05K 7/20327; H05K 7/20763; H05K 7/20381; H05K 7/20309; H05K 7/20; H05K 7/20281; H05K 7/2029; H05K 5/067; H05K 7/1497; H05K 7/20936; H05K 7/20736; H05K 7/208; G06F 1/20; G06F 2200/201; G06F 1/206; F28F 2265/12; F28F 3/12

USPC ......... 361/699, 700, 679.53, 688, 696, 697, 361/704; 165/104.33, 80.4, 104.21, 165/104.19, 104.27, 104.32, 281, 247; 257/715, 714, 23.095, 23.098
See application file for complete search history.

(56) References Cited

U.S. PATENT DOCUMENTS

| | | | |
|---|---|---|---|
| 9,686,887 B2* | 6/2017 | D'Onofrio | H05K 7/20218 |
| 2014/0218859 A1* | 8/2014 | Shelnutt | H05K 7/20809 |
| | | | 361/679.46 |
| 2015/0062806 A1* | 3/2015 | Shelnutt | H05K 7/20318 |
| | | | 361/679.53 |
| 2015/0303364 A1* | 10/2015 | Lievre | H01L 35/32 |
| | | | 136/208 |
| 2018/0279500 A9* | 9/2018 | Wang | H05K 7/20818 |
| 2019/0357378 A1* | 11/2019 | Kolar | H05K 7/20327 |
| 2020/0093037 A1* | 3/2020 | Enright | H05K 7/20381 |

FOREIGN PATENT DOCUMENTS

CN          204215321 U    *  3/2015

* cited by examiner

*Primary Examiner* — Mandeep S Buttar
(74) *Attorney, Agent, or Firm* — Nixon Peabody LLP

(57) ABSTRACT

An immersion liquid cooling tank assembly includes a generally hexagonal tank, a condenser, a manifold system, and at least one top cover. The tank includes a base and a plurality of side walls. The base and the plurality of sidewalls are connected. The condenser includes a plurality of condenser tubes. The manifold system is coupled to the condenser to assist in distributing liquid flow to and from the plurality of condenser tubes. The at least one top cover is located generally opposite to the base.

17 Claims, 5 Drawing Sheets

IMMERSION LIQUID COOLING TANK ASSEMBLY

CROSS REFERENCE TO RELATED APPLICATIONS

This application claims priority to and the benefits of U.S. Provisional Patent No. 63/137,473 filed on Jan. 14, 2021, titled "Hexagonal Tank with High Efficiency Condenser for Immersion Cooling Solution", the contents of which are hereby incorporated by reference herein in their entirety.

FIELD OF THE INVENTION

The present invention relates generally to cooling systems, and more specifically, to tank assemblies that assist in cooling heat-generating components, such as those in servers.

BACKGROUND OF THE INVENTION

Computer components, such as servers, include numerous electronic components that are powered by a common power supply. Servers generate an enormous amount of heat due to the operation of internal electronic devices such as controllers, processors, memory, and the like. Overheating from the inefficient removal of such heat has the potential to shut down or impede the operation of such devices. Due to the improvement of high-performance systems, the amount of heat that needs to be removed becomes higher with each new generation of electronic components. With the advent of more powerful components, traditional air cooling in combination with fan systems is inadequate to sufficiently remove heat generated by newer generation components.

Liquid cooling is the currently accepted solution for rapid heat removal due to the superior thermal performance from liquid cooling. Liquid cooling is more effective in absorbing and transporting heat from the heat-generating components, and allows heat removal without noise pollution. In an immersion liquid cooling system, heat-generating components, such as servers, switches, and storage devices, will be immersed in a tank holding coolant. One existing type of immersion tank is a rectangular-shaped immersion tank. This existing type of tank has disadvantages when being repaired or assembled in that the heat-generating components need to be removed directly up and down. This results in the repairing or assembling operation being laborious and not easy. Additionally, some existing immersion tanks are limited in their ability to contain a desired number of condenser tubes, which limits the cooling potential of the tanks.

Thus, there is a need for an immersion liquid cooling tank assembly that overcomes one or more of such disadvantages.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings and each claim.

According to one aspect of the present disclosure, an immersion liquid cooling tank assembly includes a generally hexagonal tank, a condenser, a manifold system, and at least one top cover. The generally hexagonal tank includes a base and a plurality of side walls. The base and the plurality of sidewalls are connected. The condenser includes a plurality of condenser tubes. The manifold system is coupled to the condenser to assist in distributing liquid flow to and from the plurality of condenser tubes. The at least one top cover is located generally opposite to the base.

According to a configuration of the above implementation, the immersion liquid cooling tank assembly is a hexagonal tank.

According to another configuration of the above implementation, at least one of the plurality of side walls is generally hexagonal shaped. In another implementation, at least two of the plurality of side walls are generally hexagonal shaped. In a yet another implementation, exactly two of the plurality of side walls are generally hexagonal shaped.

According to a further configuration of the above implementation, the generally hexagonal tank comprises metallic material.

In a further aspect of the above implementation, an exterior shape of the condenser is a generally inverted trapezoidal.

In a further aspect of the above implementation, the immersion liquid cooling tank assembly further includes a coolant located and contained within the generally hexagonal tank. The coolant may be a hydrocarbon in one embodiment and, in another embodiment, the coolant may be water or a mixture including water.

In yet a further aspect of the above implementation, the immersion liquid cooling tank assembly further includes a plurality of heat-generating components contained within the generally hexagonal tank. The plurality of heat-generating components includes one or more: storage servers, application servers, switches, and other electronic devices in one embodiment.

In yet a further aspect of the above implementation, the at least one top cover is a plurality of top covers.

In another aspect of the above implementation, an immersion liquid cooling tank assembly includes a generally hexagonal tank, a condenser, a manifold system, at least one top cover, a coolant, and a plurality of heat-generating components. The generally hexagonal tank includes a base and a plurality of side walls. The base and the plurality of sidewalls are connected. The condenser includes a plurality of condenser tubes. The manifold system is coupled to the condenser to assist in distributing liquid flow to and from the plurality of condenser tubes. The at least one top cover is located generally opposite to the base. The coolant is contained within the generally hexagonal tank. The plurality of heat-generating components is contained within the generally hexagonal tank.

According to a further aspect of the present disclosure, the coolant may be a hydrocarbon. In another embodiment, the coolant may be water or a mixture including water.

According to a configuration of the above implementation, the plurality of heat-generating components includes storage servers, application servers, switches, or other electronic devices.

According to a further aspect of the present disclosure, an immersion liquid cooling tank assembly includes a hexagonal tank, a condenser, a manifold system, and at least one top cover. The hexagonal tank includes a base and a plurality of side walls. The base and the plurality of sidewalls are connected. Exactly two of the plurality of side walls are hexagonal shaped. The condenser includes a plurality of condenser tubes. The manifold system is coupled to the condenser to assist in distributing liquid flow to and from the plurality of condenser tubes. The at least one top cover is located generally opposite to the base.

According to a configuration of the above implementation, an exterior shape of the condenser is a generally inverted trapezoidal.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

Figure 1A:
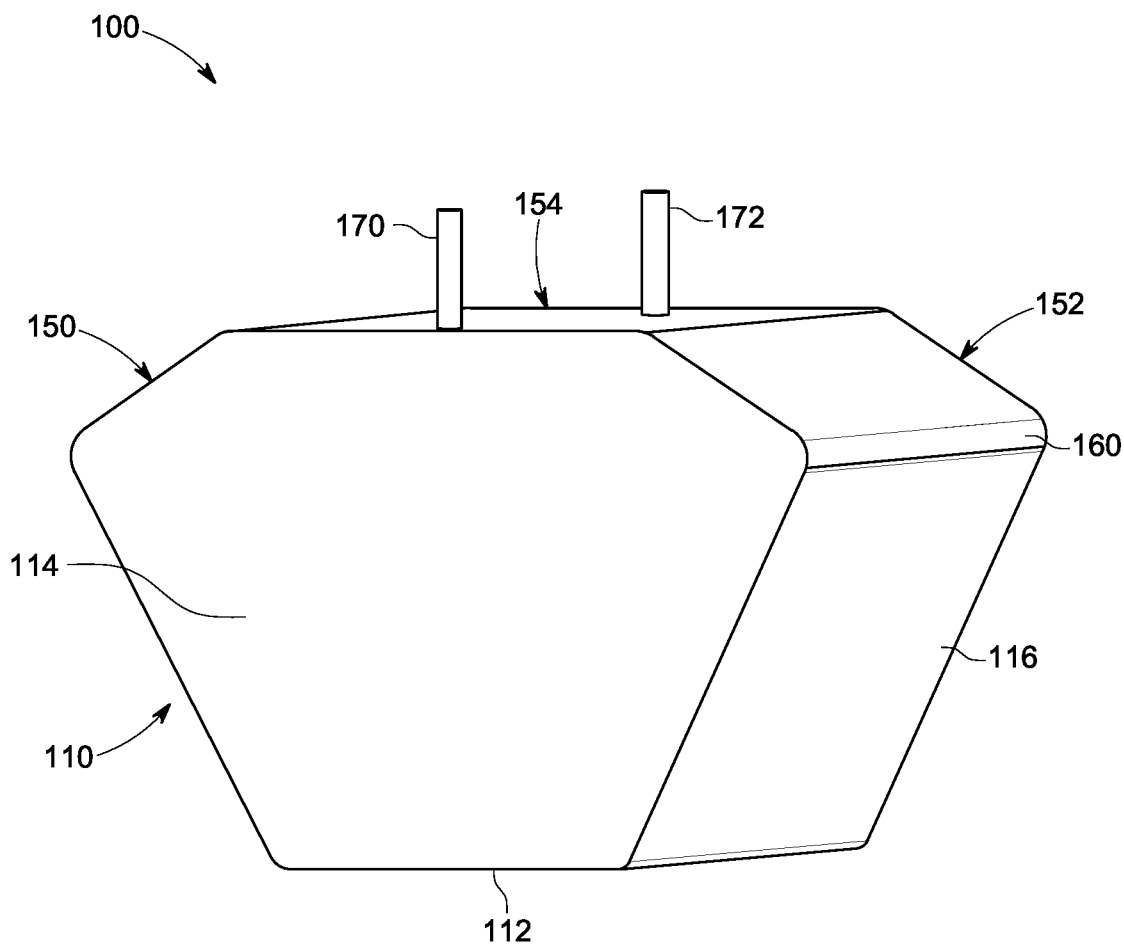
FIG. 1A is a generally front side perspective view of an immersion liquid cooling tank assembly, in accordance with one embodiment of the present disclosure.

While the invention is susceptible to various modifications and alternative forms, specific implementations have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1B:
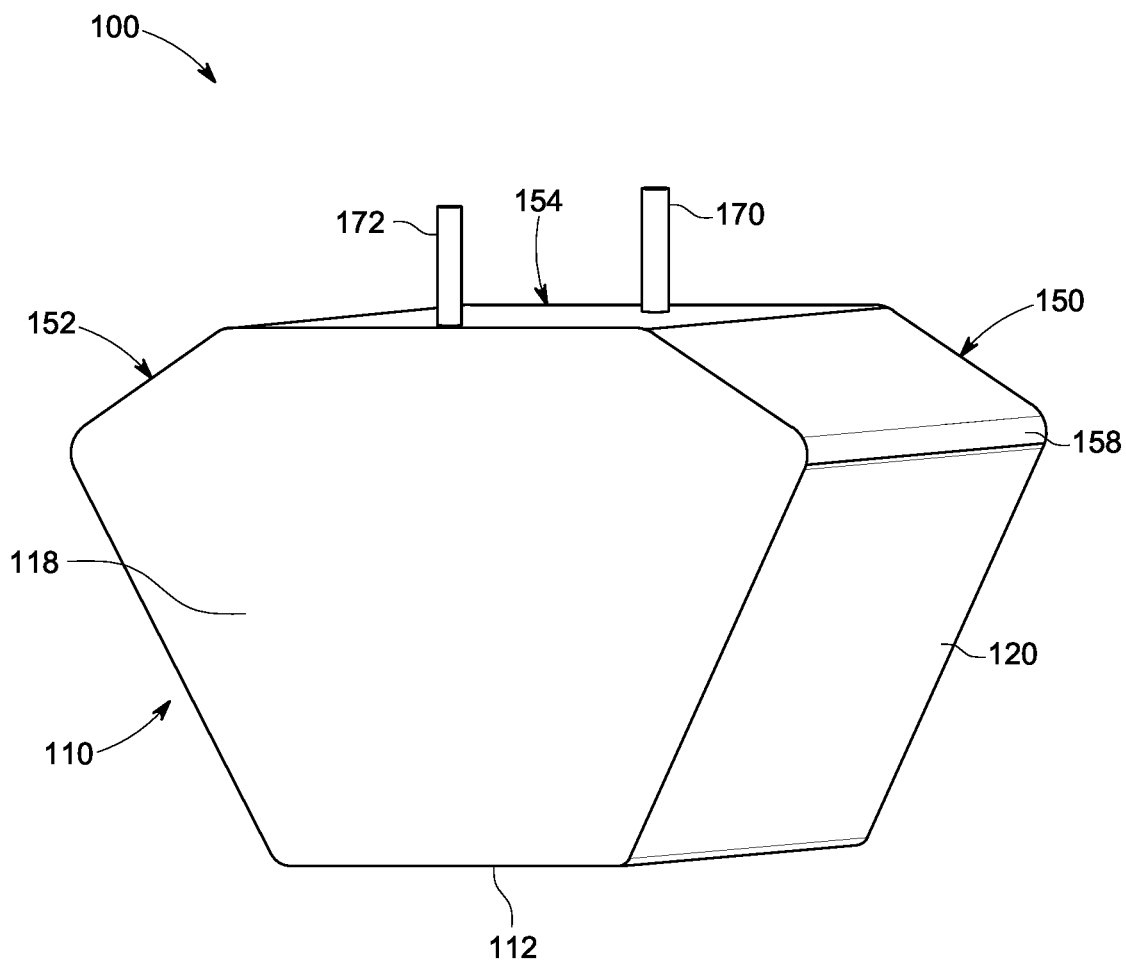
FIG. 1B is a generally back side perspective view of the immersion liquid cooling tank assembly of FIG. 1A, in accordance with one embodiment of the present disclosure.
Figure 2:
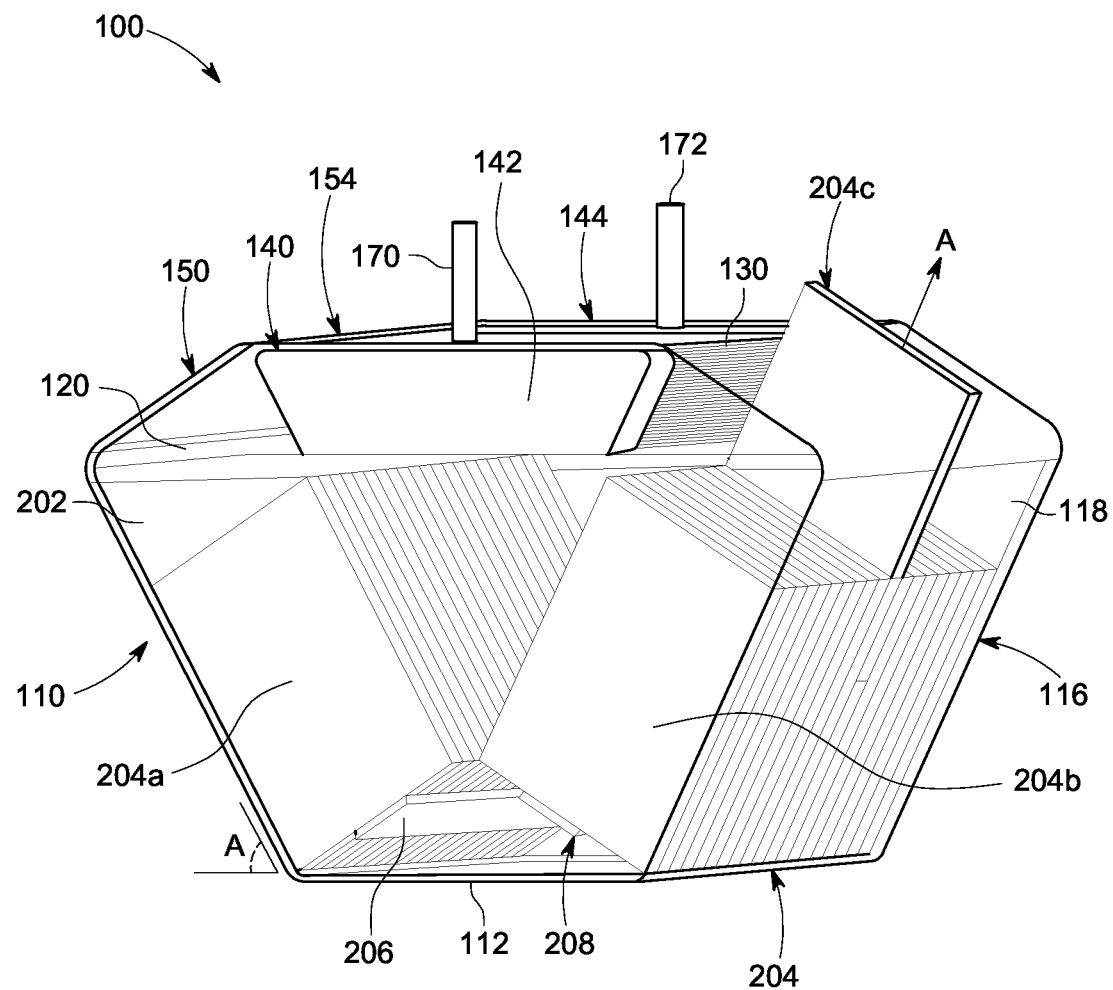
FIG. 2 is a semi-transparent, generally front side perspective view of the immersion liquid cooling tank assembly of FIG. 1A.

FIGS. 1A and 1B are generally opposing side perspective views of an immersion liquid cooling tank assembly 100, according to one embodiment of the present disclosure. FIG. 2 is a semi-transparent, generally back side perspective view of the immersion liquid cooling tank assembly 100. The immersion liquid cooling tank assembly 100 is configured to contain and cool heat-generating components, as will be discussed below. Non-limiting examples of heat-generating components that may be contained within the immersion liquid cooling tank assembly include, but are not limited to, storage servers, application servers, switches, and other electronic devices. Examples include, but are not limited to, central processing units (CPU), dual in-line memory modules (DIMM), network cards, a hard disk drives (HDD), solid state drives (SSD), graphics processing units (GPU) or field programmable gate arrays (FPGA). It is contemplated that other heat-generating components may be contained within the immersion liquid cooling tank assembly.

Referring to FIGS. 1A, 1B and 2, the immersion liquid cooling tank assembly 100 includes a generally hexagonal tank 110, a condenser 130 (FIG. 2), a manifold system 140 (FIG. 2), and top covers 150, 152, 154. The generally hexagonal tank 110 includes a base 112, and a plurality of side walls 114, 116, 118 and 120. The base 112 and the plurality of side walls 114, 116, 118 and 120 are connected or attached with each other. In some embodiments/implementations, the base 112 and the plurality of side walls 114, 116, 118 and 120 may be integrally connected. In other embodiments, the base and the plurality of side walls may be formed separately and securely attached together.

The generally hexagonal tank 110 is a hexagonal tank in one embodiment. In one embodiment, at least one of the plurality of side walls is generally hexagonal shaped. As shown in FIGS. 1A and 1B, exactly two of the plurality of side walls 114, 118 are generally hexagonal or hexagonal shaped. In other words, the exterior periphery of the side walls 114, 118 are generally hexagonal or hexagonal shaped. It is contemplated that at least two of the plurality of side walls are generally hexagonal shaped in a further embodiment.

The other two of the plurality of side walls 116, 120 in FIGS. 1A and 1B are generally rectangular in shape. It is contemplated that two or more of the plurality of side walls may be shaped differently than depicted in the immersion liquid cooling tank assembly in a further embodiment. The plurality of side walls 114, 116, 118 and 120 in FIGS. 1A and 1B are exactly four side walls. It is contemplated that the plurality of side walls may vary in number from exactly four side walls.

Figure 3:
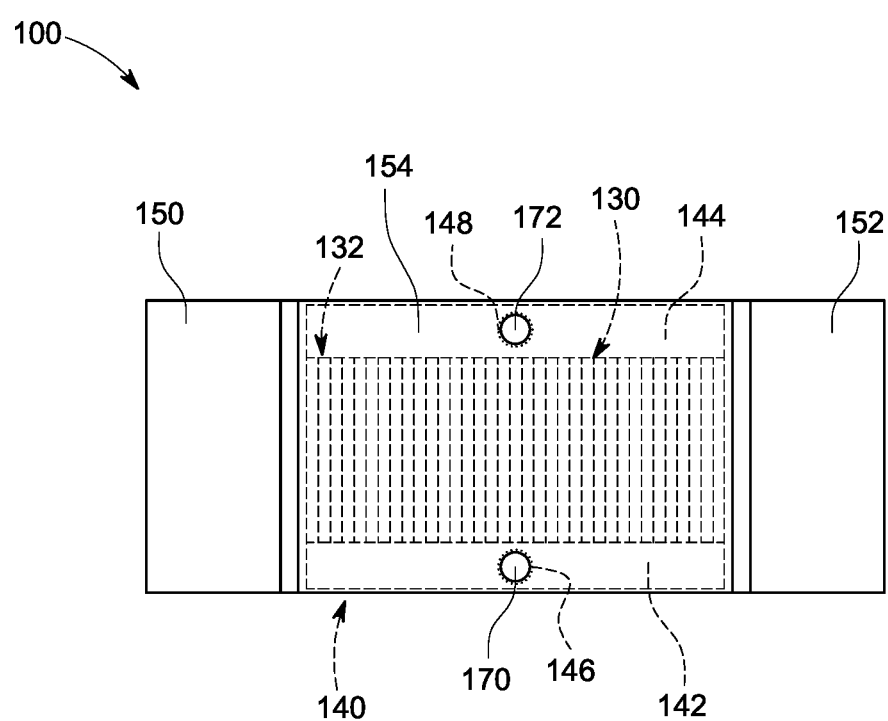
FIG. 3 is a top view of the immersion liquid cooling tank assembly of FIG. 1A.

Referring to FIGS. 2 and 3, the immersion liquid cooling tank assembly 100 includes the condenser 130 with an internal network of fluid conduits. The fluid conduits used in the condenser 130 are in the form of condenser tubes 132 in one embodiment. The plurality of condenser tubes 132 used in the condenser 130 is desirable because of their efficiency in the cooling of the coolant from its vapor phase to its liquid phase, as will be discussed below.

The plurality of condenser tubes 132 used in the condenser 130 extends between opposing ends of the manifold system 140. More specifically, the plurality of condenser tubes 132 used in the condenser 130 extends between a first manifold portion 142 to an opposing second manifold portion 144. The plurality of condenser tubes 132 in the condenser assists in containing and transporting a liquid therethrough. The liquid in the plurality of condenser tubes 132 is configured to receive or absorb transferred heat from the coolant (vapor phase), as will be discussed below. The plurality of condenser tubes may be of various sizes and shapes. One non-limiting cross-sectional shape of the plurality of condenser tubes is a generally circular form. Another non-limiting cross-sectional shape of the plurality of condenser tubes is a general oval form.

It is contemplated that the plurality of tubes may be other shapes including polygonal shapes or other non-polygonal shapes. For example, the plurality of condenser tubes may have a cross-section being a polygonal shape (e.g., a square or a rectangle). It is, of course, desirable for the plurality of condenser tubes to be shaped and sized for effective heat transfer with the coolant (vapor phase).

The exterior shape of the condenser 130 shown in FIG. 2 is a generally inverted trapezoidal. More specifically, the exterior shape of the condenser 130 is an inverted isosceles trapezoidal. This exterior shape of the condenser 130 shown in FIG. 2 is desirable because the heat-transfer area is expanded, which allows for a greater and quicker heat transfer between the coolant (vapor phase) and the condenser 130.

The immersion liquid cooling tank assembly 100 of FIG. 2 includes exactly one condenser 130. It is contemplated that an immersion liquid cooling tank assembly may include a plurality of condensers. This would be dependent on the desired cooling capabilities of the immersion liquid cooling tank assembly. The desired cooling capabilities would depend on factors such as the number and size of the heat-generating components, the size of the immersion liquid cooling tank assembly, and the type and amount of coolant being used.

As shown in FIG. 3, the condenser 130 extends between the first manifold portion 142 to the opposing second manifold portion 144 of the manifold system 140. The manifold system 140 is coupled to the condenser 130 to assist in distributing liquid flow to and from the plurality of condenser tubes. The first manifold portion 142 handles and distributes cold liquid (e.g., water), while the second manifold portion 144 handles and consolidates removal of the hot liquid (e.g., water). The first manifold portion 142 has at least one larger opening 146 that is in fluid communication with cold liquid piping 170. The cold liquid piping 170 contains cold liquid (e.g., water) that enters the at least one larger opening 146 in the first manifold portion 142. The first manifold portion 142 further includes a plurality of openings formed therein to receive and distribute the cold liquid to the plurality of condenser tubes 132 of the condenser 130.

The second manifold portion 144 has at least one larger opening 148 that is in fluid communication with hot liquid piping 172. The hot liquid piping 172 removes hot liquid (e.g., water) that enters the at least one larger opening 148 in the second manifold portion 144. The second manifold portion 144 further includes a plurality of openings formed therein that collects and consolidates the hot liquid from the plurality of condenser tubes 132 to be removed via the hot liquid piping 172. The hot liquid piping 172 carries away the heat generated from the heat-generating components.

The exterior shape of the first manifold portion 142 shown in FIG. 2 is a generally inverted trapezoidal. More specifically, the exterior shape of the first manifold portion 142 is an inverted isosceles trapezoidal. This exterior shape of the first manifold portion 142 shown in FIG. 2 generally corresponds with the exterior shape of the condenser 130. The exterior shape (not shown) of the second manifold portion 144 is shaped the same as the first manifold portion 142. It is contemplated that the first and second manifold portions may be of different shapes and sizes.

The immersion liquid cooling tank assembly further includes at least one top cover. Referring back to FIGS. 1A and 1B, the immersion liquid cooling tank assembly 100 includes the first top cover 150, the second top cover 152, and the third top cover 154. The first, second and third top covers 150, 152, 154 are located generally opposite of the base 112. The first, second and third top covers 150, 152, 154 assist in providing a closed environment or system for the immersion liquid cooling tank assembly 100.

At least one or two of the plurality of top covers is movable or removable to gain access to the heat-generating components contained with the generally hexagonal tank. Specifically, as shown in FIGS. 1A and 1B, the first and second top covers 150, 152 are movable or removable to gain access to the heat-generating components. To assist in moving the first and second top covers 150, 152 between open and closed positions, respective hinges 158, 160 are used. As shown specifically in FIG. 1B, the hinge 158 connects the first top cover 150 to the side wall 120. Similarly, the hinge 160 of FIG. 1A connects the second top cover 152 to the side wall 116. It is contemplated that other mechanisms besides hinges may be used to assist in gaining access to the plurality of heat-generating components Referring still to FIGS. 1A and 1B, the third top cover 154 is shown. The third top cover 154 is movable or removable to assist in repair or maintenance. The third top cover 154 assists in providing a closed environment or system for the immersion liquid cooling tank assembly 100 when the first and second top covers 150, 152 are in closed positions. The third top cover 154 may also assist in positioning and securing the condenser 130 and the manifold system 140 in a desired position that is spaced from the coolant (liquid phase) in one embodiment. The third top cover 154 includes a first one of a plurality of apertures that is aligned with the cold liquid piping 170 and the at least one larger opening 146 of the first manifold portion 142 shown in FIG. 3. The third top cover 154 further includes a second one of a plurality of apertures that is aligned with the hot liquid piping 172 and the at least one larger opening 148 of the second manifold portion 144 shown in FIG. 3.

It is contemplated that at least one top cover may be configured differently than shown in FIGS. 1A and 1B in other embodiments. For example, the at least one top cover may be a continuous top cover in which at least one portion can be removed or moved to gain access to an interior of the generally hexagonal tank 110.

Referring back to FIG. 2, the immersion liquid cooling tank assembly 100 includes a coolant 202 and a plurality of heat-generating components 204 located and contained within the generally hexagonal tank 110. Specifically, the plurality of heat-generating components 204 includes a first set 204a of the plurality of heat-generating components 204 and a second set 204b of the plurality of heat-generating components 204. The coolant 202 may be selected from a variety of coolants to assist in removing heat generated from the plurality of heat-generating components 204 by directly contacting those components. In one embodiment, the coolant is a thermally-conductive, dielectric liquid coolant. The coolant 202 assists in removing heat generated from the heat-generated components 204 by directly contacting those components. The liquids to be used as the coolant typically have very good insulating properties so that contact with the heat-generated components can be accomplished in a safe manner. The coolant 202 changes between its liquid and vapor phases easily and at a desired temperature.

The type of coolant is selected based on the requirement of thermal design. Non-limiting examples of coolants include fluorocarbons, water (e.g., deionized water, mixtures including water, and hydrocarbons. It is contemplated that other coolants may be used that can remove and absorb heat from the heat-generating components stored within the generally hexagonal tank.

The plurality of heat-generating components 204 shown in FIG. 2 is a plurality of servers. One of the heat-generating components 204 (heat-generating component 204c) is shown in the process of being removed from the generally hexagonal tank 110. The heat-generating component 204c is being removed along the general direction of arrow A. For improved clarity, the second top cover 152 (shown in FIGS. 1A and 1B) has been removed from FIG. 2. As discussed above, the first and second top covers 150, 152 are moved from a closed position to an open position via respective hinges 158, 160 so as to gain access to the plurality of heat-generating components 204. Non-limiting examples of heat-generating components that may be contained within the immersion liquid cooling tank assembly include, but are not limited to, storage servers, application servers, switches, or other electronic devices. Examples include, but are not limited to, CPU, DIMM, network card, a HDD, SSD, GPU or FPGA.

The first set 204a of the plurality of heat-generating components 204 rests on a support structure 206. The support structure 206 in this embodiment extends from the side wall 114 across the interior of the generally hexagonal tank 110 to the opposing side wall 118. The support structure 206 is configured to support and position the first set 204a of the plurality of heat-generating components 204. The support structure 206 is configured to abut the first set 204a of the plurality of heat-generating components 204. The support structure 206 is angled to assist in positioning and removing the heat-generating components 204 from the immersion liquid cooling tank assembly 100. The support structure 206 as shown in FIG. 2 is generally at an angle A from about 20 to about 80 degrees, and is typically from about 30 to about 75 degrees, or from about 35 degrees to about 70 degrees.

Figure 4:
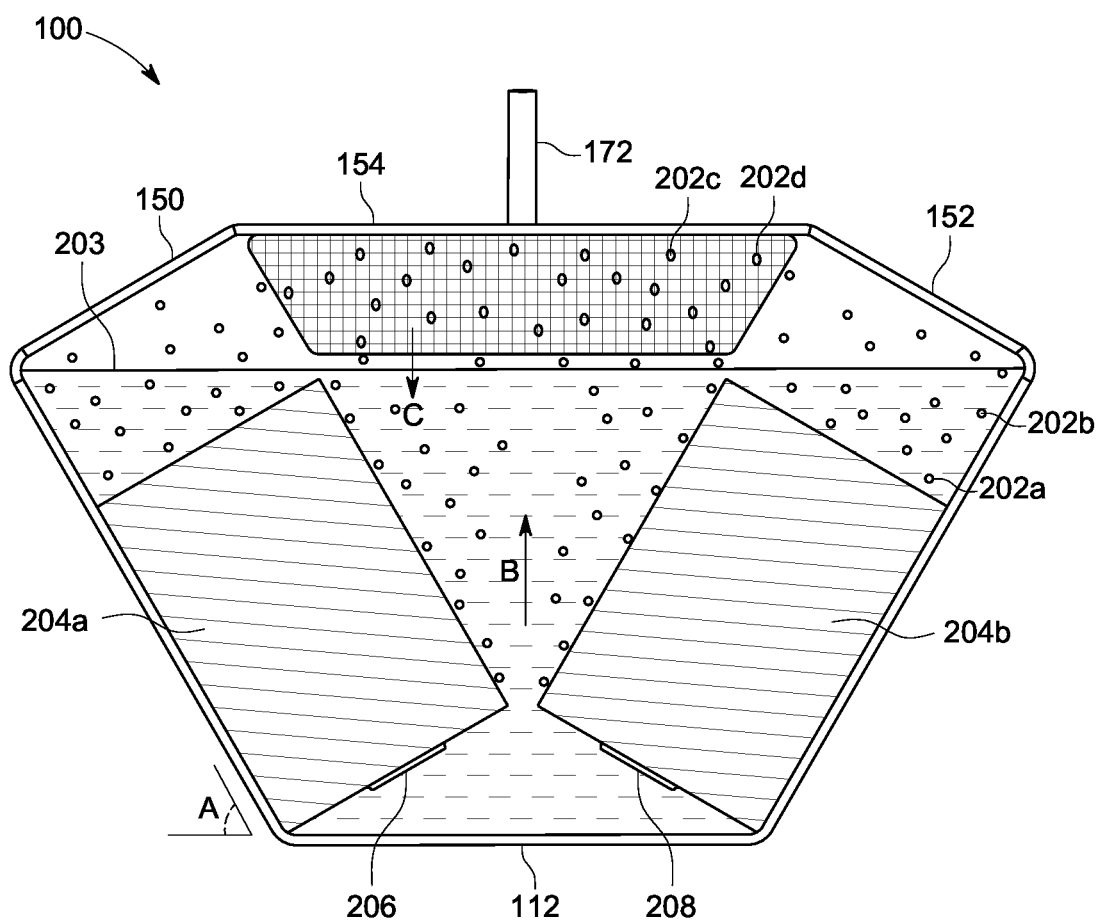
FIG. 4 is a generally cross sectional side view taken generally along a middle of the immersion liquid cooling tank assembly of FIG. 1A.

The process of heat transfer is shown best in FIG. 4, which is a generally cross sectional side view taken generally along a middle of the immersion liquid cooling tank assembly 100 of FIG. 1A. The immersion liquid cooling tank assembly is configured to be used in a two-phase immersion process. In this process, a two-phase temperature evaporation process cools the heat-generating components via the coolant 202. The coolant 202 in FIG. 4 surrounds the first and second sets 204a, 240b of the plurality of heat-generating components 204. The level of the coolant 202 is shown with reference to coolant level 203. As the coolant 202 (liquid phase) contacts the first and second sets of heat-generating components 204a, 204b, molecules of the coolant in the liquid phase become gaseous molecules of coolant. These plurality of gaseous coolant molecules is depicted in FIG. 4 as small circles. For improved clarity, only gaseous coolant molecules 202a, 202b are identified in FIG. 4. These gaseous coolant molecules 202a, 202b move in the general direction of arrow B. As the gaseous molecules travel in the general direction of arrow B, the gaseous molecules contact the condenser 130. After contacting the condenser, the gaseous coolant molecules are transformed into liquid coolant molecules. These plurality of liquid coolant molecules is depicted in FIG. 4 as general oval or drops. For improved clarity, only liquid coolant molecules 202c, 202d are identified in FIG. 4. The liquid coolant molecules then travel in the general direction of arrow C back to a coolant bath.

The generally hexagonal tank 110 comprises a metallic material. Non-limiting metallic materials that may be used in forming the generally hexagonal tank include steel. Examples of steel that may be used in forming the generally hexagonal tank include, but are not limited to, stainless steel, and cold-rolled steel such as SGCC steel. It is contemplated that other materials besides metallic material may be used in forming the generally elliptical tank, if such materials have the desired properties including strength to hold the material inside. The support structures 206, 208 may be formed using the same material as the material used in forming the generally hexagonal tank 110.

The immersion liquid cooling tank assembly 100 functions passively in that additional components are not needed to assist in the interaction of the coolant 202 (liquid phase) and the heat-generating components 204, or in the interaction between the coolant 202 (vapor phase) and the condenser 130. Thus, the immersion liquid cooling tank assembly 100 is a passive tank.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. An immersion liquid cooling tank assembly comprising:
    a generally hexagonal tank including a base and a plurality of side walls, the base connected to the plurality of sidewalls, two of the plurality of side walls are generally hexagonal shaped and are located opposite of each other, two of the plurality of side walls are generally rectangular shaped and are located opposite of each other;
    a condenser including a plurality of condenser tubes;
    a manifold system coupled to the condenser to assist in distributing liquid flow to and from the plurality of condenser tubes; and
    at least one top cover located generally opposite to the base.

2. The tank assembly of claim 1, wherein the tank is hexagonal.

3. The tank assembly of claim 1, wherein the generally hexagonal tank comprises metallic material.

4. The tank assembly of claim 1, wherein an exterior shape of the condenser is a generally inverted trapezoidal.

5. The tank assembly of claim 1 further including a coolant located and contained within the generally hexagonal tank.

6. The tank assembly of claim 5, wherein the coolant is a fluorocarbon.

7. The tank assembly of claim 5, wherein the coolant is water or a mixture including water.

8. The tank assembly of claim 1 further including a plurality of heat-generating components contained within the generally hexagonal tank.

9. The tank assembly of claim 8, wherein the plurality of heat-generating components includes storage servers, application servers, switches, or other electronic devices.

10. The tank assembly of claim 9 further including a plurality of support structures that are located and configured within the generally hexagonal tank to support heat-generating components.

11. The tank assembly of claim 1, wherein the at least one top cover is a plurality of top covers.

12. An immersion liquid cooling tank assembly comprising:
    a generally hexagonal tank including a base and a plurality of side walls, the base connected to the plurality of sidewalls, two of the plurality of side walls are generally hexagonal shaped and are located opposite of each other, two of the plurality of side walls are generally rectangular shaped and are located opposite of each other;
    a condenser including a plurality of condenser tubes;
    a manifold system coupled to the condenser to assist in distributing liquid flow to and from the plurality of condenser tubes; and
    at least one top cover located generally opposite to the base;
    a coolant contained within the generally hexagonal tank; and
    a plurality of heat-generating components contained within the generally hexagonal tank.

13. The tank assembly of claim 12, wherein the coolant is a fluorocarbon.

14. The tank assembly of claim 12, wherein the coolant is water or a mixture including water.

15. The tank assembly of claim 12, wherein the plurality of heat-generating components includes one or more of: storage servers, application servers, switches, and other electronic devices.

16. An immersion liquid cooling tank assembly comprising:
    a hexagonal tank including a base and a plurality of side walls, the base connected to the plurality of sidewalls, wherein exactly two of the plurality of side walls are hexagonal shaped and are located opposite of each other, two of the plurality of side walls are rectangular shaped and are located opposite of each other;
    a condenser including a plurality of condenser tubes;
    a manifold system coupled to the condenser to assist in distributing liquid flow to and from the plurality of condenser tubes; and
    at least one top cover located generally opposite to the base.

17. The tank assembly of claim 16, wherein an exterior shape of the condenser is a generally inverted trapezoidal.

* * * * *